(12) United States Patent
Wu et al.

(10) Patent No.: US 10,788,518 B2
(45) Date of Patent: Sep. 29, 2020

(54) DETECTION CIRCUIT AND SWITCH MODULE USING THE SAME

(71) Applicant: ANPEC ELECTRONICS CORPORATION, Hsinchu (TW)

(72) Inventors: Tsung-Yu Wu, Hsinchu (TW); Yu-Yu Chen, Yunlin County (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 221 days.

(21) Appl. No.: 16/154,295

(22) Filed: Oct. 8, 2018

(65) Prior Publication Data

US 2020/0003806 A1     Jan. 2, 2020

(30) Foreign Application Priority Data

Jul. 2, 2018   (TW) .................................. 107122791

(51) Int. Cl.
| | |
|---|---|
| *G01R 19/00* | (2006.01) |
| *H02H 9/08* | (2006.01) |
| *G01R 19/165* | (2006.01) |
| *H03K 5/24* | (2006.01) |
| *H02H 9/02* | (2006.01) |

(52) U.S. Cl.
CPC ......... *G01R 19/16528* (2013.01); *H03K 5/24* (2013.01); *H02H 9/025* (2013.01)

(58) Field of Classification Search
CPC .......... G01R 19/0084; G01R 19/165; G01R 19/175; G01R 19/16528; G01R 19/16538; G06F 1/26; G06F 1/305; H02H 3/087; H02H 9/001; H02H 9/025; H03K 5/24; H03K 5/1536; H03K 5/2454; H03K 5/2463
See application file for complete search history.

(56) References Cited

U.S. PATENT DOCUMENTS 7,821,756 B2 * 10/2010 Chishima ............... H02H 3/087
                                              361/93.7
9,152,197 B2 * 10/2015 Liu ........................... G06F 1/26

FOREIGN PATENT DOCUMENTS

| CN | 107153439 A | 9/2017 |
|---|---|---|
| TW | 201505305 A | 2/2015 |

* cited by examiner

*Primary Examiner* — Minh N Tang
(74) *Attorney, Agent, or Firm* — Li & Cai Intellectual Property (USA) Office

(57) ABSTRACT

A detection circuit and a switch module using the same is provided. The detection circuit includes a comparison circuit. A first input end of the comparison circuit is coupled to an output end of a power supply, and a second input end of the comparison circuit is coupled to an input end of a switch circuit. The comparison circuit compares voltage information or current information obtained via its first input end and it second input end, and accordingly generates an output signal. The output signal indicates whether there is an external resistor between the power supply and the switch circuit. According to the output signal, the switch circuit determines how a current provided by the power supply is to be detected, and accordingly continues or stops providing the current to a load.

20 Claims, 2 Drawing Sheets

DETECTION CIRCUIT AND SWITCH MODULE USING THE SAME

CROSS-REFERENCE TO RELATED PATENT APPLICATION

This application claims the benefit of priority to Taiwan Patent Application No. 107122791, filed on Jul. 2, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a detection circuit and a switch module using the same, and more particularly to a detection circuit suitable for a current limiter (LC) or an over current protection circuit (OCP Circuit), and a switch module using the same.

BACKGROUND OF THE DISCLOSURE

In general, a switch circuit disposed in a current limiter or an over current protection circuit is used to detect a current size of a power supply, so as to turn on or turn off the internal transistor switch to avoid damage to the load caused by an excessive current. In a common practice, a switch circuit configured in a current limiter or an over current protection circuit would determine an amount of current or a current size provided by the power supply by detecting the current flowing through its transistor switch. However, such an approach may lead to inaccuracy in detection of an electrical current due to the intrinsic characteristics of the internal circuit components or the differences in manufacturing.

SUMMARY OF THE DISCLOSURE

In response to the above-referenced technical inadequacies, the present disclosure provides a detection circuit and a switch module using the same.

In one aspect, the present disclosure provides a detection circuit including a comparison circuit that has a first input end, a second input end and an output end.

Specifically, the first input end of the comparison circuit is coupled to an output end of a power supply and the second input end of the comparison circuit is coupled an input end of a switch circuit.

More specifically, the comparison circuit is used for comparing a voltage of the output end of the power supply with a voltage of the input end of the switch circuit and generating an output signal accordingly. Further, if a voltage difference between the voltage of the output end of the power supply and the voltage of the input end of the switch circuit is greater than or equal to a predetermined voltage difference, the output signal indicates that there is an external resistor configured between the power supply and the switch circuit, and if a voltage difference between the voltage of the output end of the power supply and the voltage of the input end of the switch circuit is smaller than a predetermined voltage difference, the output signal indicates that there is no said external resistor configured between the power supply and the switch circuit.

In one aspect, the present disclosure provides a detection circuit including a comparison circuit that has a first input end, a second input end and an output end, in which the first input end of the comparison circuit is coupled to an output end of a power supply and the second input end of the comparison circuit is coupled an input end of a switch circuit.

Specifically, the comparison circuit is used for comparing a current of the first input end with a current of the second input end flowing into the comparison circuit and generating an output signal accordingly.

Further, if a current difference between the current of the first input end and the current of the second input end flowing into the comparison circuit is greater than or equal to a predetermined current difference, then the output signal indicates that there is an external resistor configured between the power supply and the switch circuit, and if a current difference between the current of the first input end and the current of the second input end flowing into the comparison circuit is smaller than a predetermined current difference, then the output signal indicates that there is no said external resistor configured between the power supply and the switch circuit.

In one aspect, the present disclosure provides a switch module coupled between a power supply and a load, at least including a switch circuit that includes a transistor switch, and a detection circuit. Further, the switch circuit determines the way of detecting a magnitude of a current provided by the power supply based on an output signal generated by the detection circuit signal, and turns on or turns off the transistor switch based on the magnitude of the current provided by the power supply, so as to provide or stop providing a current to the load.

In general, the main feature of the detection circuit and the switch module using the same in the present disclosure is that the detection circuit can detect whether there is an external resistor configured between a power supply and a switch circuit, and generate an output signal accordingly. If the output signal received by the switch circuit indicates that there is an external resistor configured between the power supply and the switch circuit, the switch circuit will automatically calculate a current supplied by the power supply according to the resistance value and the voltage drop of the external resistor to form a closed circuit or an open circuit to avoid a damage to the load caused by an excessive current.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
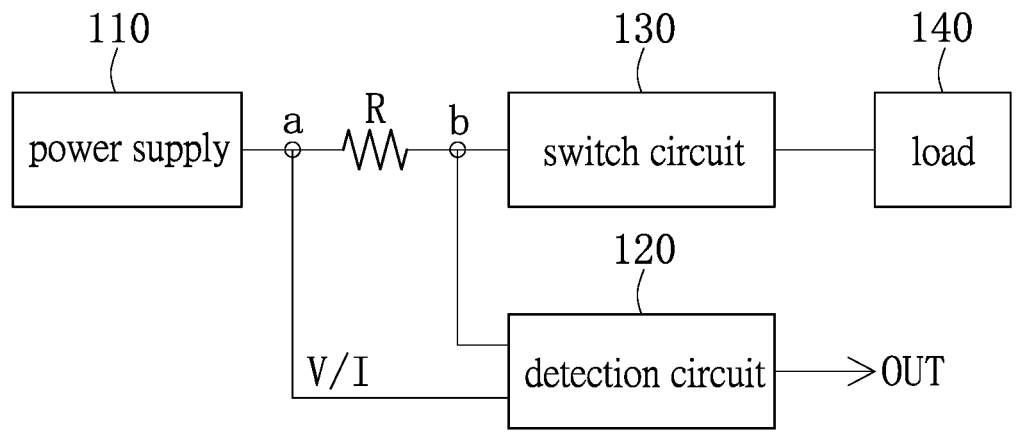
FIG. 1 is a block diagram showing the position of a detection circuit according to an exemplary embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The detection circuit provided by the invention is mainly used to detect whether an external resistor is disposed between a switch circuit and a power supply. For example, the switch circuit may be a switch circuit that is disposed in either a current limiter or an over current protection circuit. When it is detected that there is an external resistance between the switch circuit and the power supply by the detection circuit provided by the present disclosure, the current limiter or the over current protection circuit controls the switch circuit directly according to a current size of the power supply using the resistance value and the voltage drop of the external resistor, and forms a closed circuit or an open circuit in the switch circuit accordingly, so as to provide or stop providing a current to a load.

Reference is made to FIG. 1, which is a block diagram showing the configuration of a detection circuit according to an exemplary embodiment of the present disclosure.

As shown in FIG. 1, the detection circuit 120 provided by the present disclosure is coupled to an output end a of a power supply 110 and an input end b of a switch circuit 130, and the switch circuit 130 is coupled between the power supply 110 and a load 140. In the present disclosure, the supply power 110 can be a common power supply or an adapter, the switch circuit 130 can be disposed in a switch circuit inside a current limiter or an over current protection circuit, and the load 140 can be various types of functional chips, but the present disclosure is not limited in this respect. The switch circuit 130 can be directly coupled to the load 140, or coupled to the load 140 through a charging circuit (which is not shown), but the present disclosure is not limited in this respect.

Generally speaking, the main operating principle of the detection circuit 120 provided by the present disclosure is to detect the voltage information V or the current information I of the output end a of the power supply 110 and the input end b of the switch circuit 130, and then to generate an output signal OUT according to the detected voltage information V or current information I. This output signal OUT represents whether an external resistor is configured between a power supply and a switch circuit. Therefore, if it is found that an external resistance is configured between the switch circuit and the power supply by the output signal OUT, the current limiter or the over current protection circuit can control the switch circuit 130 to more accurately measure the current size provided by the power supply directly according to the resistance value and the voltage drop of the external resistor, and forms a closed circuit or an open circuit in the switch circuit accordingly, so as to provide or stop providing a current to a load.

The following embodiments provide further details on different configurations of the detection circuit 120 provided by the present disclosure.

One Embodiment of a Detection Circuit

Figure 2A:
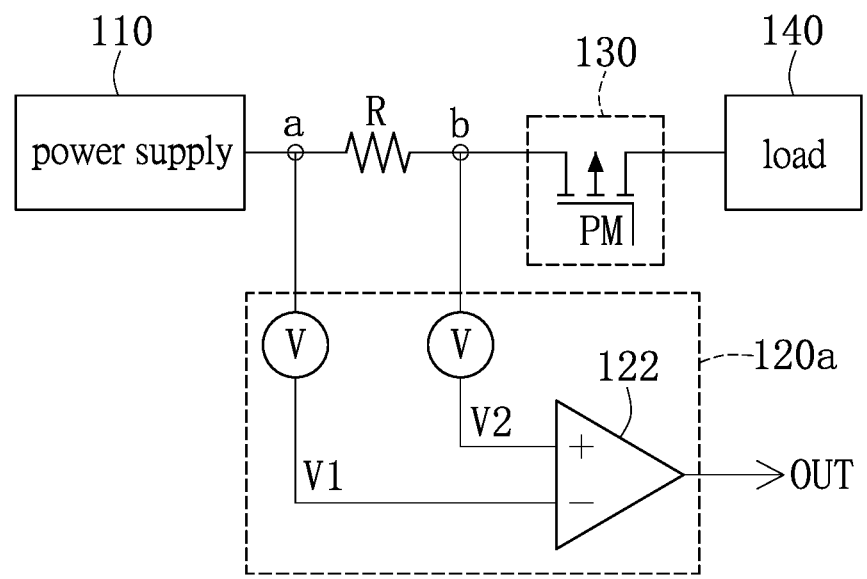
FIG. 2A and FIG. 2B are schematic diagrams of the detection circuit of FIG. 1 in different embodiments.

Reference is made to FIG. 2A, which is a schematic diagram of the detection circuit of FIG. 1 in one embodiment of the present disclosure.

As shown in FIG. 2A, the present embodiment provides a detection circuit 120a including a comparison circuit 122. The comparison circuit 122 has a first input end, a second input end and an output end. The first input end of the comparison circuit 122 is coupled to an output end a of a power supply 110, and the second input end of the comparison circuit 122 is coupled to an input end b of a switch circuit 130. Further, as illustrated in FIG. 2A, the first input end of the comparison circuit 122 is coupled to the output end a of the power supply 110 via a voltage meter, and the second input end of the comparison circuit 122 is coupled the input end b of the switch circuit 130 via another voltage meter.

The operating principal of the detection circuit 120a provided by this embodiment is as follows.

The comparison circuit 122 measures a voltage V1 of the output end a of the power supply 110 via a voltage meter, and measures a voltage V2 of the input end b of the switch circuit 130 via another voltage meter. Next, the comparison circuit 122 compares the voltage V1 of the output end a of the power supply 110 with the voltage V2 of the input end b of the switch circuit 130 to generate an output signal OUT. This output signal OUT represents whether there is an external resistor R configured between the power supply 110 and a switch circuit 130.

In more detail, if the voltage difference between the voltage V1 of the output end a of the power supply 110 and the voltage V2 of the input end b of the switch circuit 130 is greater than or equal to a predetermined voltage difference, it indicates that an external resistor R should exist between the switch circuit 130 and the supply power supply 110 to cause the voltage difference between the output end a of the supply power 110 and the input end b of the switch circuit 130. Conversely, if the voltage difference between the voltage V1 of the output end a of the power supply 110 and the voltage V2 of the input end b of the switch circuit 130 is smaller than a predetermined voltage difference, it indicates that no external resistor R exists between the switch circuit 130 and the supply power supply 110 so that there is only a slight voltage difference between the output end a of the supply power 110 and the input end b of the switch circuit 130 due to the wire material of the circuit.

As shown in FIG. 2A, the switch circuit 130 includes at least one transistor switch PM. For example, a switch circuit 130 may be a switch circuit configured in a current limiter or an over current protection circuit, and the transistor switch PM may be a PMOS transistor, but the present disclosure is not limited in this respect.

In general, a switch circuit located in a current limiter or an over current protection circuit is used to detect a current size of a power supply, so as to turn on or turn off the internal transistor switch to avoid damage to the load from an excessive current. In a common practice, a switch circuit configured in a current limiter or an over current protection circuit would determine the amount of current provided by the power supply by detecting the current flowing through its transistor switch. However, such an approach may lead to inaccuracy in detection of an electrical current due to the intrinsic characteristics of the internal circuit components or the differences in manufacturing.

Therefore, in this embodiment, if the comparison circuit 122 determines that the voltage difference between the voltage V1 of the output end a of the power supply 110 and the voltage V2 of the input end b of the switch circuit 130 is greater than or equal to a predetermined voltage difference, then an output signal OUT is outputted indicating that an external resistor R should exist between the switch circuit 130 and the supply power supply 110. Hence, with this output signal OUT, the switch circuit 130 can be informed that there is an external resistor R configured between the power supply 110 and the switch circuit 130, and under this condition, the switch circuit 130 will automatically calculate a current supplied by the power supply 110 according to the resistance value and the voltage drop of the external resistor R.

As mentioned above, when determining the amount of current provided by the power supply by detecting the current flowing through its transistor switch, the current may not be accurately detected due to the intrinsic characteristics of the internal circuit components or the differences in manufacturing. In contrast, in this embodiment, when the detection circuit 120a detects that there is an external resistor R configured between the power supply 110 and the switch circuit 130, the switch circuit 130 will detect a current flowing through the external resistor R directly according to the relationship between the resistance and the voltage of the external resistor R, and determine the amount of current supplied by the power supply 110. Therefore, it is less susceptible to other circuitry factors and the current can be accurately detected by the detection circuit.

Another Embodiment of the Detection Circuit

Figure 2B:
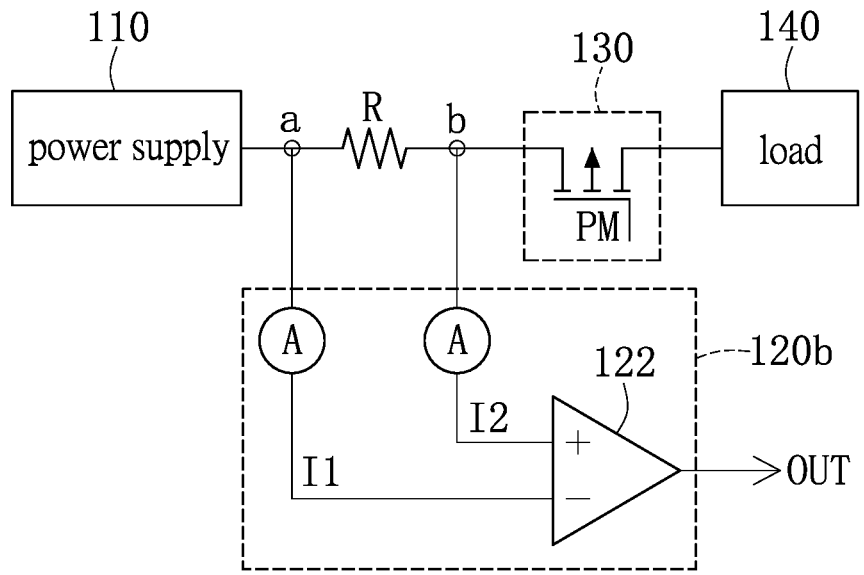

Please refer to FIG. 2B, which is a schematic diagram of the detection circuit of FIG. 1 in another embodiment of the present disclosure.

As shown in FIG. 2B, this embodiment provides a detection circuit 120b including a comparison circuit 122. The comparison circuit 122 has a first input end, a second input end and an output end. The first input end of the comparison circuit 122 is coupled to an output end a of a power supply 110 and the second input end of the comparison circuit 122 is coupled an input end b of a switch circuit 130. Further, as illustrated in FIG. 2B, the first input end of the comparison circuit 122 is coupled to the output end a of the power supply 110 via a current meter, and the second input end of the comparison circuit 122 is coupled the input end b of the switch circuit 130 via another current meter.

The operating principal of the detection circuit 120b provided by this embodiment is as follows.

The comparison circuit 122 measures a current I1 flowing into first input end of comparison circuit 122 via a current meter, and measures a current I2 flowing into second input end of comparison circuit 122 via another current meter. Next, the comparison circuit 122 compares the current I1 flowing into first input end of comparison circuit 122 with the current I2 flowing into second input end of comparison circuit 122 to generate an output signals OUT. This output signal OUT represents whether there is an external resistor R configured between the power supply 110 and a switch circuit 130.

In more detail, since the internal resistance value is very small, the current difference between the current I1 flowing into first input end of comparison circuit 122 and the current I2 flowing into second input end of comparison circuit 122 is smaller than a predetermined current difference or approaches zero, meaning that there should be no external resistor R configured between the switch circuit 130 and the supply power supply 110. On the other hand, if the current difference between the current I1 flowing into first input end of comparison circuit 122 and the current I2 flowing into second input end of comparison circuit 122 is equal or greater than the predetermined current difference, then an external resistor R should exist between the switch circuit 130 and the supply power supply 110 to generate two currents measured respectively at the output end a of the supply power 110 and the input end b of the switch circuit 130 with values that do not approach zero.

As shown in FIG. 2B, the switch circuit 130 includes at least one transistor switch PM. For example, a switch circuit 130 may be a switch circuit configured in a current limiter or an over current protection circuit, and the transistor switch PM may be a PMOS transistor, but the present disclosure is not limited in this respect.

As mentioned before, in general, a switch circuit located in a current limiter or an over current protection circuit is used to detect a current size of a power supply, so as to turn on or turn off the internal transistor switch to avoid damage to the load from an excessive current. In a common practice, a switch circuit configured in a current limiter or an over current protection circuit would determine the amount of current provided by the power supply by detecting the current flowing through its transistor switch. However, such an approach may lead to inaccuracy in detection of an electrical current due to the intrinsic characteristics of the internal circuit components or the differences in manufacturing.

Therefore, in this embodiment, if the comparison circuit 122 determines that the current difference between the voltage V1 of the output end a of the power supply 110 and the voltage V2 of the input end b of the switch circuit 130 is greater than or equal to a predetermined voltage difference, an output signal OUT is outputted indicating that an external resistor R should exist between the switch circuit 130 and the supply power supply 110. Hence, with this output signal OUT, the switch circuit 130 can be informed that there is an external resistor R configured between the power supply 110 and the switch circuit 130. Under this condition, the switch circuit 130 will automatically calculate a current supplied by the power supply 110 according to the resistance value and the voltage drop of the external resistor R.

As mentioned above, when determining the amount of current provided by the power supply by detecting the current flowing through its transistor switch, the current may not be accurately detected due to the intrinsic characteristics of the internal circuit components or the differences in manufacturing. In contrast, in this embodiment, when the detection circuit 120b detects that there is an external resistor R configured between the power supply 110 and the switch circuit 130, the switch circuit 130 will detect a current flowing through the external resistor R directly according to the relationship between the resistance and the voltage of the external resistor R and determine the amount of current supplied by the power supply. Therefore, it is less susceptible to other circuitry factors and the current would be accurately detected by the detection circuit.

It should be noted that, in the preceding two embodiments, when the comparison circuit 122 determines that the voltage difference between the voltage V1 of the output end a of the power supply 110 and the voltage V2 of the input end b of the switch circuit 130 is smaller than a predetermined current difference, or when the comparison circuit 122 determines that the current difference between the current I1 flowing into first input end of comparison circuit 122 and the current I2 flowing into second input end of comparison circuit 122 is smaller than a predetermined current difference, an output signal OUT is outputted indicating that no external resistor R should exist between the switch circuit 130 and the supply power supply 110. At this time, the switch circuit 130 will continue to detect the current flowing through its transistor switch PM so as to determine the current size supplied by the power supply.

One Embodiment of the Switch Circuit

Figure 3:
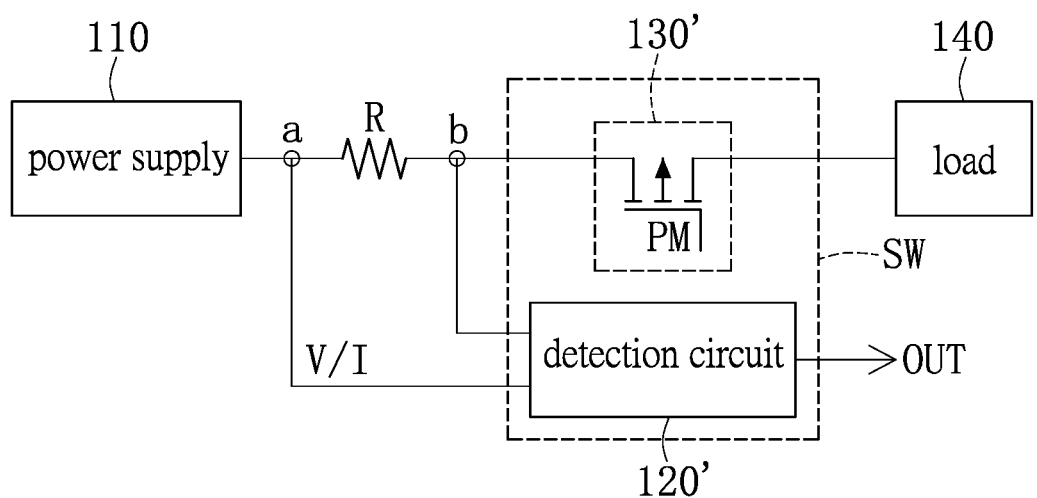
FIG. 3 shows the block diagram of the switch module in an exemplary Embodiment of the present disclosure.

Reference is made to FIG. 3, which shows the block diagram of the switch module in an exemplary embodiment of the present disclosure.

As mentioned above, the detection circuit provided by the present disclosure is mainly used to detect whether an external resistor is disposed between a switch circuit and a power supply. For example, the switch circuit may be a switch circuit that is disposed in either a current limiter or an over current protection circuit. It is worth noting that the detection circuit and the switch circuit can be two independently disposed circuits, such as the detection circuit and the switch circuit as in the above two embodiments of the present disclosure. Alternatively, the detection circuit and the switch circuit can be implemented in a switching module, i.e. the switching module in this embodiment, but the present disclosure is not limited in this respect.

As shown in FIG. 3, the switch module SW provided by this embodiment includes a switch circuit 130' and a detection circuit 120' used for detecting whether there is an external resistor R configured between a switch circuit 130' and a supply power supply 110.

That is to say, in this embodiment, the detection circuit 120' and the switch circuit 130' are respectively a circuitry block under the circuit architecture of the switch module SW.

The switch circuit 130' in the switch module SW provided in this embodiment is coupled between a power supply 110 and a load 140, and includes a transistor switch PM. The main operating principle of the switch module SW is that the switch circuit 130' will determine how a current size provided by the power supply 110 is to be detected based on an output signal OUT, and based on the current size of the power supply 110, it is determined whether to turn on or turn off the transistor switch PM, so as to continue or stop providing the current to the load 140.

It should be noted that, in this embodiment, the detection circuit 120' may be a detection circuit provided by any of the aforementioned embodiments. In other words, the circuit structure and operating principle of the detection circuit 120' can be identical to the detection circuit provided by any of the embodiments mentioned above. Therefore, the present disclosure descriptions regarding the circuitry and operating principles of the detection circuit 120' can be referred to in the previous embodiments of the present disclosure, and will not be repeated herein.

Possible Effects of the Embodiments

In conclusion, an advantage of the detection circuit and the switching module using the same provided by the present disclosure is that the detection circuit can detect whether there is an external resistor configured between the supply power and the switch circuit, and generate an output signal accordingly. If the output signal received by the switch circuit indicates that there is an external resistor configured between the power supply and the switch circuit, then the switch circuit will automatically calculate a current supplied by the power supply according to the resistance value and the voltage drop of the external resistor, so as to form a closed circuit or an open circuit to avoid damage to the load from an excessive current.

As mentioned above, when determining the amount of current provided by the power supply by detecting the current flowing through its transistor switch, the current may not be accurately detected due to the intrinsic characteristics of the internal circuit components or the differences in manufacturing. In contrast, the present disclosure detects a current flowing through the external resistor R directly according to the relationship between the resistance and the voltage of the external resistor, and determines the amount of current supplied by the power supply. Therefore, it is less susceptible to other circuitry factors and the current can be accurately detected by the detection circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A detection circuit, comprising:
    a comparison circuit having a first input end for being coupled to an output end of a power supply, a second input end for being coupled to an input end of a switch circuit, and an output end,
    and configured to compare a voltage of the output end of the power supply with a voltage of the input end of the switch circuit and generate an output signal accordingly;

wherein if a voltage difference between the voltage of the output end of the power supply and the voltage of the input end of the switch circuit is greater than or equal to a predetermined voltage difference, then the output signal indicates that there is an external resistor configured between the power supply and the switch circuit, and if the voltage difference between the voltage of the output end of the power supply and the voltage of the input end of the switch circuit is smaller than the predetermined voltage difference, then the output signal indicates that there is no said external resistor configured between the power supply and the switch circuit.

2. The detection circuit as claimed in claim 1, wherein the switch circuit at least includes a transistor switch, and the switch circuit detects a magnitude of a current provided by the power supply, so as to turn on or turn off the transistor switch.

3. The detection circuit as claimed in claim 2, wherein if the output signal indicates that there is said external resistor configured between the power supply and the switch circuit, the switch circuit calculates the current provided by the power supply according to the output signal using a resistance value and a voltage drop of the external resistor, and if the output signal indicates that there is no said external resistor configured between the power supply and the switch circuit, the switch circuit detects a current flowing through the transistor switch and calculates the current provided by the power supply according to the detected current flowing through the transistor.

4. A switch module coupled between the power supply and a load, at least comprising:
the switch circuit including the transistor switch; and
the detection circuit according to claim 3;
wherein the switch circuit turns on or turns off the transistor switch based on the magnitude of the current provided by the power supply to provide or stop providing a current to the load.

5. The switch module as claimed in claim 4, wherein the switch module is suitable for a current limiter or an over current protection circuit.

6. A switch module coupled between the power supply and a load, at least comprising:
the switch circuit including the transistor switch; and
the detection circuit according to claim 2;
wherein the switch circuit determines a way of detecting the magnitude of the current provided by the power supply based on the output signal generated by the detection circuit, and turns on or turns off the transistor switch based on the magnitude of the current provided by the power supply to provide or stop providing a current to the load.

7. The switch module as claimed in claim 6, wherein the switch module is suitable for a current limiter or an over current protection circuit.

8. The detection circuit as claimed in claim 1, wherein the switch circuit is suitable for a current limiter or an over current protection circuit.

9. A switch module coupled between the power supply and a load, at least comprising:
the switch circuit including an transistor switch; and
the detection circuit according to claim 1;
wherein the switch circuit determines a way of detecting a magnitude of a current provided by the power supply based on the output signal generated by the detection circuit, and turns on or turns off the transistor switch based on the magnitude of the current provided by the power supply, so as to provide or stop providing a current to the load.

10. The switch module as claimed in claim 9, wherein the switch module is suitable for a current limiter or an over current protection circuit.

11. A detection circuit, comprising:
a comparison circuit having a first input end for being coupled to an output end of a power supply, a second input end for being coupled to an input end of a switch circuit, and an output end,
and configured to compare a current of the first input end with a current of the second input end flowing into the comparison circuit and generate an output signal accordingly;
wherein if a current difference between the current of the first input end and the current of the second input end flowing into the comparison circuit is greater than or equal to a predetermined current difference, then the output signal indicates that there is an external resistor configured between the power supply and the switch circuit, and if the current difference between the current of the first input end and the current of the second input end flowing into the comparison circuit is smaller than the predetermined current difference, then the output signal indicates that there is no said external resistor configured between the power supply and the switch circuit.

12. The detection circuit as claimed in claim 11, wherein the switch circuit at least includes a transistor switch, and the switch circuit detects a magnitude of a current provided by the power supply, so as to turn on or turn off the transistor switch.

13. The detection circuit as claimed in claim 12, wherein if the output signal indicates that there is said external resistor configured between the power supply and the switch circuit, the switch circuit calculates the current provided by the power supply according to the output signal using a resistance value and a voltage drop of the external resistor, and if the output signal indicates that there is no said external resistor configured between the power supply and the switch circuit, the switch circuit detects a current flowing through the transistor switch and calculates the current provided by the power supply according to the detected current flowing through the transistor.

14. A switch module coupled between the power supply and a load, at least comprising:
the switch circuit including the transistor switch; and
the detection circuit according to claim 13;
wherein the switch circuit turns on or turns off the transistor switch based on the magnitude of the current provided by the power supply to provide or stop providing a current to the load.

15. The switch module as claimed in claim 14, wherein the switch module is suitable for a current limiter or an over current protection circuit.

16. A switch module coupled between the power supply and a load, at least comprising:
the switch circuit including the transistor switch; and
the detection circuit according to claim 12;
wherein the switch circuit determines a way of detecting the magnitude of the current provided by the power supply based on the output signal generated by the detection circuit, and turns on or turns off the transistor switch based on the magnitude of the current provided by the power supply to provide or stop providing a current to the load.

17. The switch module as claimed in claim 16, wherein the switch module is suitable for a current limiter or an over current protection circuit.

18. The detection circuit as claimed in claim 11, wherein the switch circuit is suitable for a current limiter or an over current protection circuit.

19. A switch module coupled between the power supply and a load, at least comprising:
   the switch circuit including an transistor switch; and
   the detection circuit according to claim 11;
   wherein the switch circuit determines a way of detecting a magnitude of a current provided by the power supply based on the output signal generated by the detection circuit, and turns on or turns off the transistor switch based on the magnitude of the current provided by the power supply, so as to provide or stop providing a current to the load.

20. The switch module as claimed in claim 19, wherein the switch module is suitable for a current limiter or an over current protection circuit.

\* \* \* \* \*